(12) United States Patent
Lee et al.

(10) Patent No.: US 11,258,052 B2
(45) Date of Patent: Feb. 22, 2022

(54) METHOD OF MANUFACTURING ORGANIC LIGHT EMITTING DISPLAY DEVICE USING PROTECTION FILM WITH TOP OPENING PATTERNS

(71) Applicant: SAMSUNG DISPLAY CO., LTD., Yongin-si (KR)

(72) Inventors: Seung Kuk Lee, Yongin-si (KR); Beomjun Cheon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 39 days.

(21) Appl. No.: 16/710,323

(22) Filed: Dec. 11, 2019

(65) Prior Publication Data

US 2020/0194734 A1    Jun. 18, 2020

(30) Foreign Application Priority Data

Dec. 13, 2018 (KR) .......................... 10-2018-0160749

(51) Int. Cl.
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0017* (2013.01); *H01L 51/0097* (2013.01); *H01L 51/5256* (2013.01); *H01L 51/5293* (2013.01); *H01L 2251/566* (2013.01)

(58) Field of Classification Search
CPC . H01L 51/56; H01L 51/0017; H01L 51/5256; H01L 51/5293; H01L 51/0097
See application file for complete search history.

(56) References Cited

U.S. PATENT DOCUMENTS

| | | | | |
|---|---|---|---|---|
| 2010/0253225 | A1* | 10/2010 | Lifka | A61N 5/0616 315/112 |
| 2012/0098026 | A1* | 4/2012 | Kwack | H01L 51/5253 257/100 |
| 2013/0328480 | A1* | 12/2013 | Joo | H05B 33/10 313/512 |
| 2019/0036050 | A1* | 1/2019 | Kim | H01L 51/0097 |
| 2019/0131569 | A1* | 5/2019 | Ma | H01L 51/5253 |
| 2019/0165328 | A1* | 5/2019 | Yi | H01L 51/56 |
| 2020/0343480 | A1* | 10/2020 | Shimogawara | H01L 27/32 |

FOREIGN PATENT DOCUMENTS

| | | |
|---|---|---|
| KR | 10-2013-0025113 A | 3/2013 |
| KR | 10-2018-0077928 A | 7/2018 |

* cited by examiner

*Primary Examiner* — Michael Jung
(74) *Attorney, Agent, or Firm* — Kile Park Reed & Houtteman PLLC

(57) ABSTRACT

A method of manufacturing an organic light emitting display device includes forming a plurality of display structures on a lower substrate, forming a top protection film including a plurality of top opening patterns on the lower substrate and the display structures such that the top opening patterns do not overlap the display structures, cutting the lower substrate between two adjacent display structures among the plurality of display structures along a first cutting line that is located at at least a portion of the top opening patterns, and separating the lower substrate to form a plurality of display panels each including the display structure and a portion of the lower substrate.

20 Claims, 15 Drawing Sheets

METHOD OF MANUFACTURING ORGANIC LIGHT EMITTING DISPLAY DEVICE USING PROTECTION FILM WITH TOP OPENING PATTERNS

CROSS-REFERENCE TO RELATED APPLICATION

Korean Patent Application No. 10-2018-0160749, filed on Dec. 13, 2018, in the Korean Intellectual Property Office, and entitled: "Method of Manufacturing Organic Light Emitting Display Device Using Protection Film," is incorporated by reference herein in its entirety.

BACKGROUND

1. Field

Example embodiments relate to a method of manufacturing an organic light emitting display device using a protection film.

2. Description of the Related Art

An organic light emitting display ("OLED") device may include a plurality of display structures in a matrix shape (or a lattice shape) on a lower substrate. For example, the lower substrate, pixel circuits, pixels, and a TFE structure may be defined as one display panel. A plurality of display panels may be formed together and then separated into respective display panels by performing a cutting process.

SUMMARY

Embodiments are directed to a method of manufacturing an organic light emitting display device, the method including forming a plurality of display structures on a lower substrate, forming a top protection film including a plurality of top opening patterns on the lower substrate and the display structures such that the top opening patterns do not overlap the display structures, cutting the lower substrate between two adjacent display structures among the plurality of display structures along a first cutting line that is located at at least a portion of the top opening patterns, and separating the lower substrate to form a plurality of display panels each including the display structure and a portion of the lower substrate.

The top protection film may include an adhesive layer in contact with the lower substrate, and a protection layer formed on the adhesive layer.

The top opening patterns may surround each of the display structures.

The top opening patterns may include first top opening patterns arranged along a first direction that is parallel to an upper surface of the lower substrate, and second top opening patterns arranged along a second direction that is parallel to an upper surface of the lower substrate and perpendicular to the first direction.

Extending directions of the first top opening patterns and the second top opening patterns may intersect each other, and each of the display structures may be located in a plurality of spaces that are defined by the first top opening patterns and the top second opening patterns.

The first cutting line may overlap the first opening patterns.

The method may further include cutting the lower substrate along a second cutting line that is perpendicular to the first cutting line.

The second cutting line may overlap the second top opening patterns.

The lower substrate may be cut along the first and second cutting lines.

The first top opening patterns may be integrally formed, and the second top opening patterns may be integrally formed.

The display structures may be spaced apart from each other on the lower substrate in a lattice arrangement.

Each of the display structures may include a plurality of semiconductor elements formed on the lower substrate, a plurality of light emitting structures formed on the semiconductor elements, and a thin film encapsulation structure formed on the light emitting structures.

The thin film encapsulation structure may include a first thin film encapsulation layer formed on the light emitting structures, the first thin film encapsulation layer including inorganic materials having flexibility, a second thin film encapsulation layer formed on the first thin film encapsulation layer, the second thin film encapsulation layer including organic materials having flexibility, and a third thin film encapsulation layer formed on the second thin film encapsulation layer, the third thin film encapsulation layer including the inorganic materials having flexibility.

Prior to forming the display structures on the lower substrate, the method may further include providing a rigid glass substrate, and forming the lower substrate on the rigid glass substrate.

After forming the top protection film including the top opening patterns, the method may further include removing the rigid glass substrate, and forming a bottom protection film including a plurality of bottom opening patterns on a lower surface of the lower substrate, wherein the bottom opening patterns overlap the top opening patterns, respectively.

After forming the display panels each including the display structure and a portion of the lower substrate, the method may further include forming a pattern film on a lower surface of each of the display panels after the bottom protection film is removed in each of the display panels, and forming a polarizing layer on an upper surface of each of the display panels after the top protection film is removed in each of the display panels.

The lower substrate may include a first organic layer including organic materials having flexibility, a first barrier layer formed on the first organic layer, the first barrier layer including inorganic materials having flexibility, a second organic layer formed on the first barrier layer, the second organic layer including organic materials having flexibility, and a second barrier layer formed on the second organic layer, the second barrier layer including inorganic materials having flexibility.

The top opening patterns may provide a path for removing bubbles formed between the top protection film and the lower substrate.

BRIEF DESCRIPTION OF THE DRAWINGS

Features will become apparent to those of skill in the art by describing in detail example embodiments with reference to the attached drawings in which.

DETAILED DESCRIPTION

Figure 1:
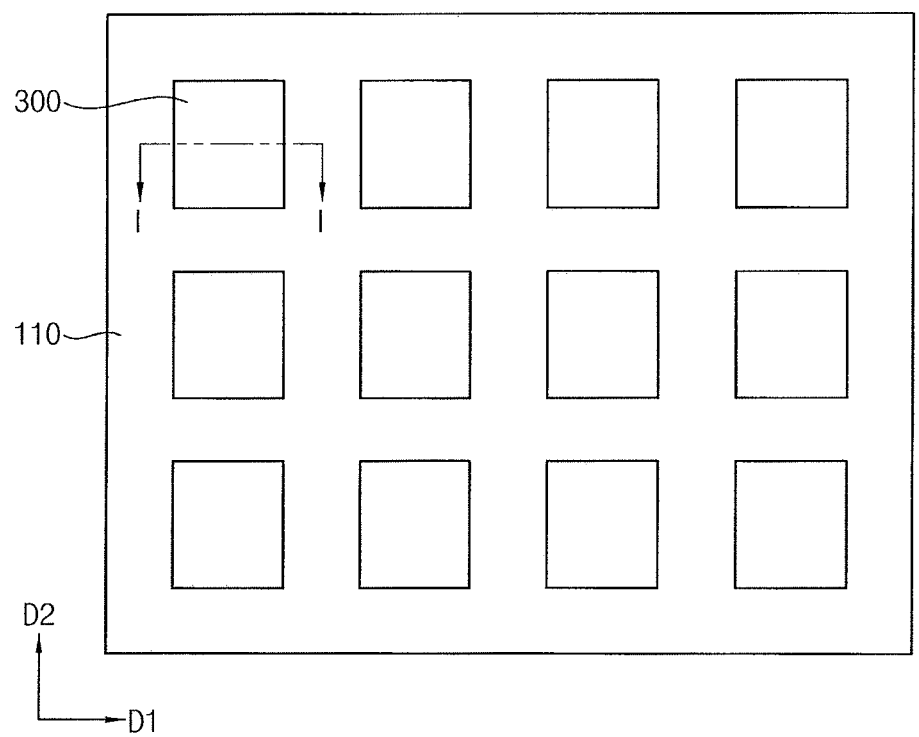
FIGS. 1 through 19 illustrate cross-sectional views of stages in a method of manufacturing an organic light emitting display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
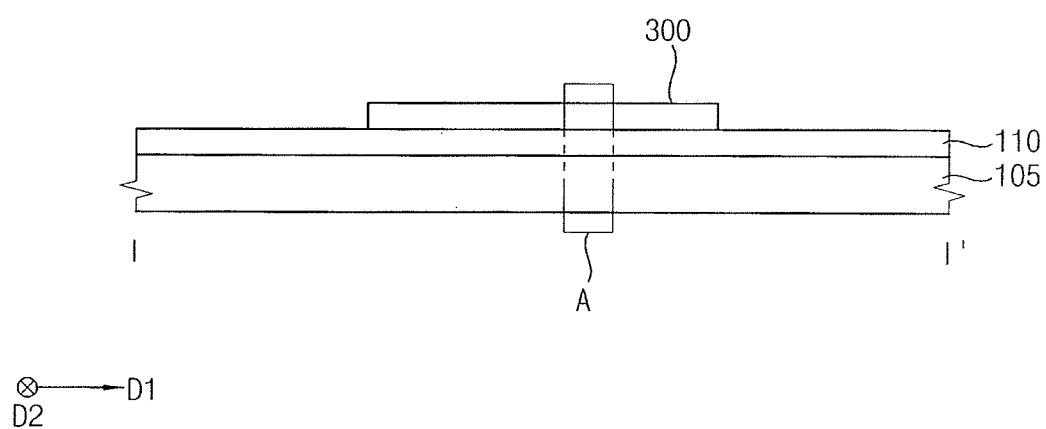
Figure 3:
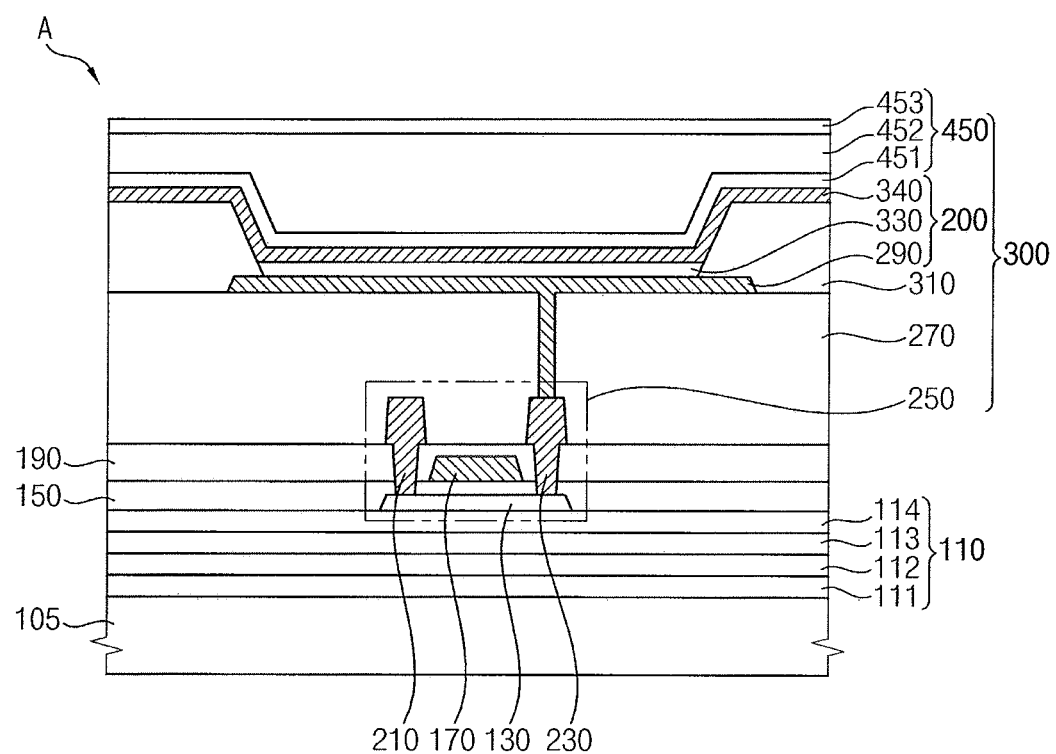
Figure 4:
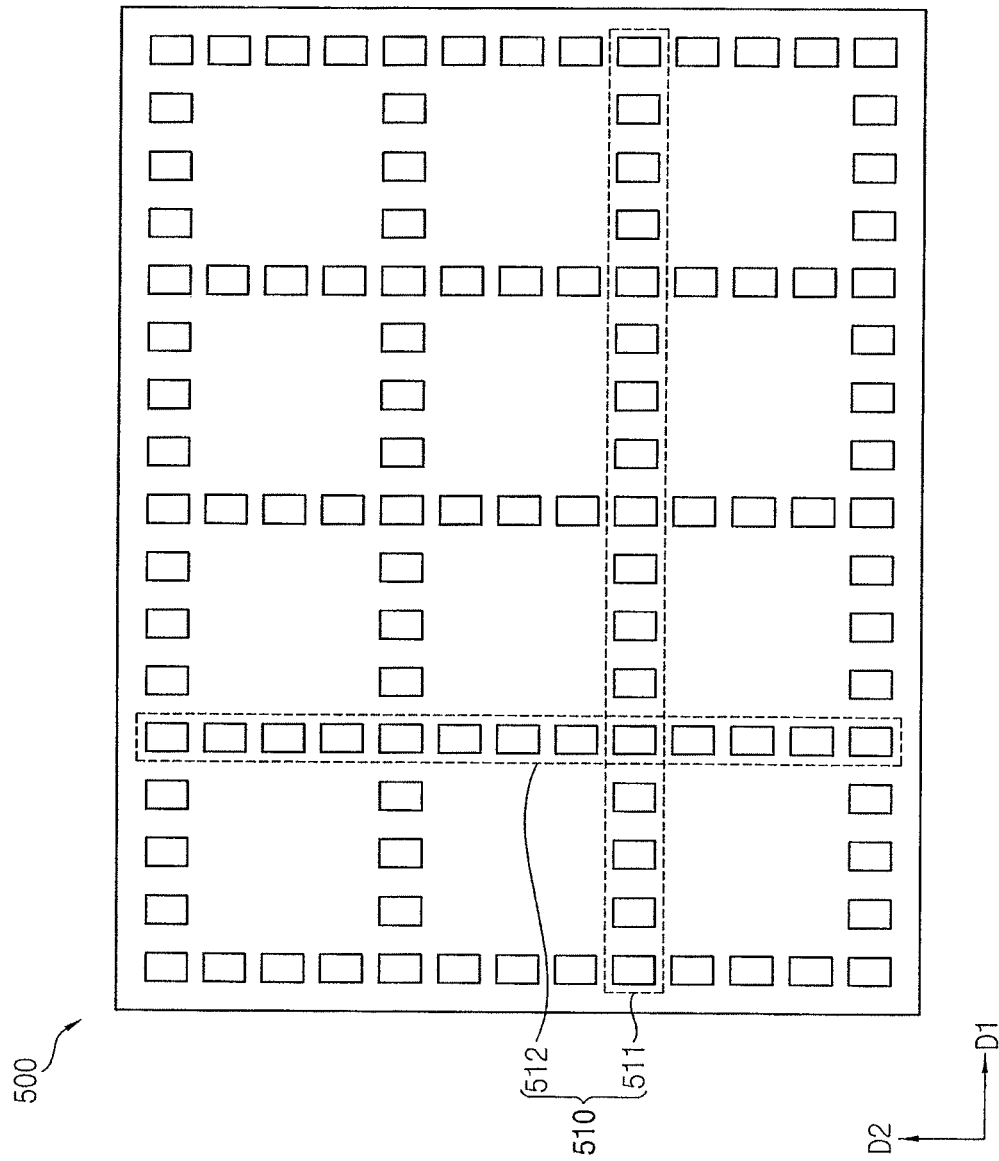
Figure 5:
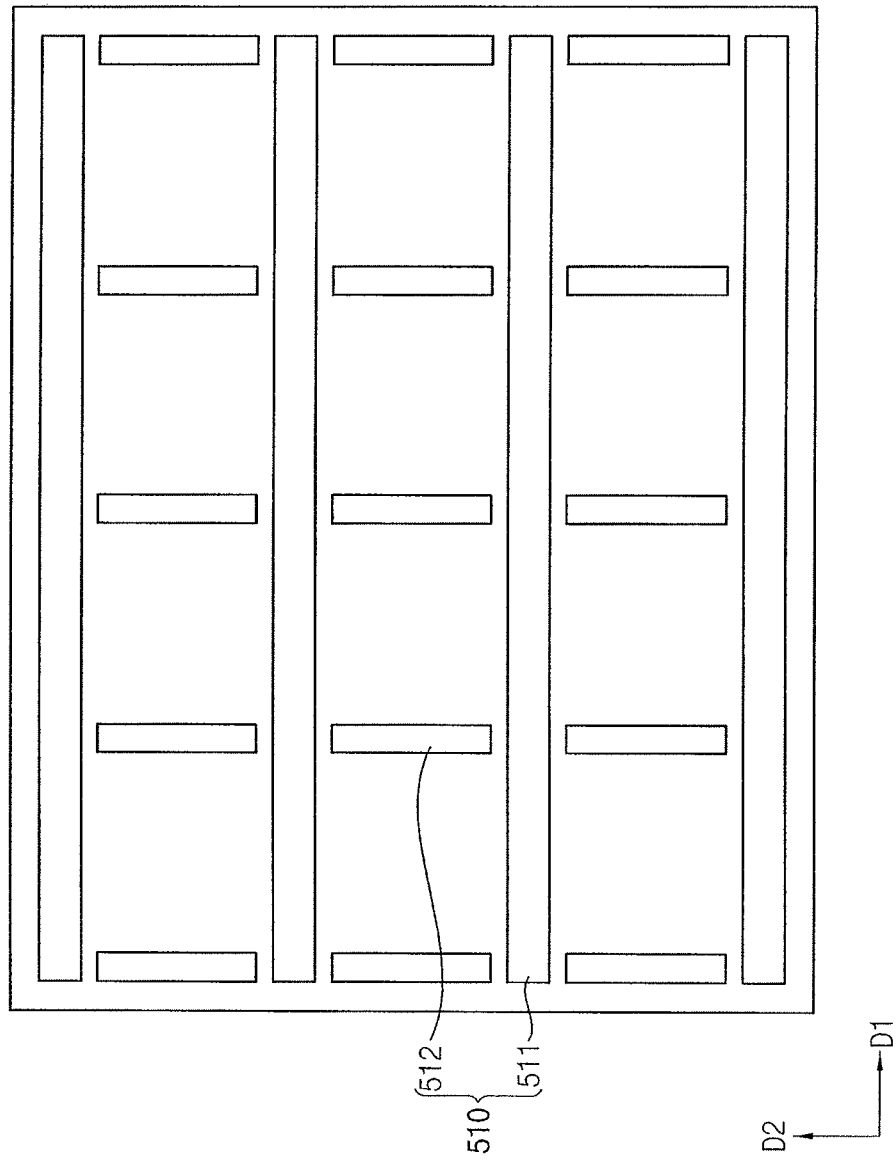
Figure 6:
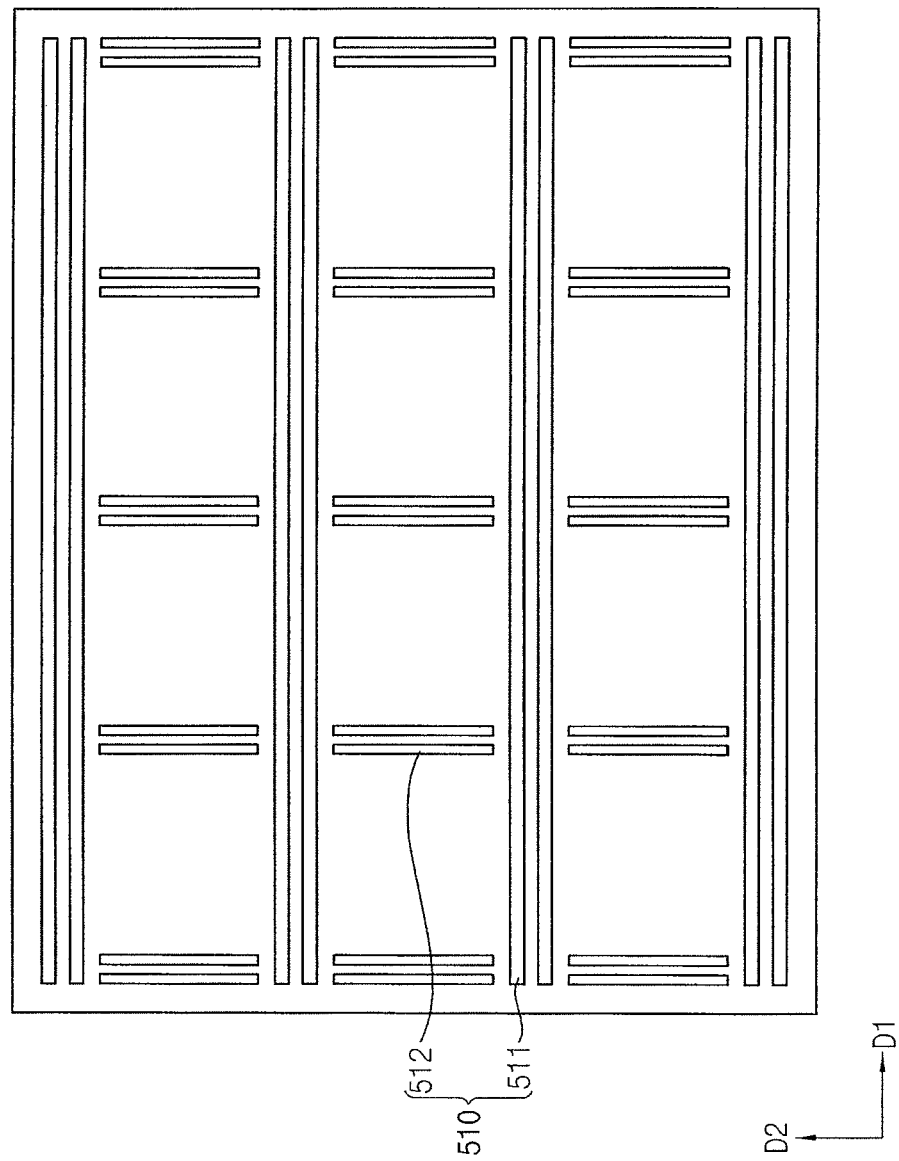
Figure 10:
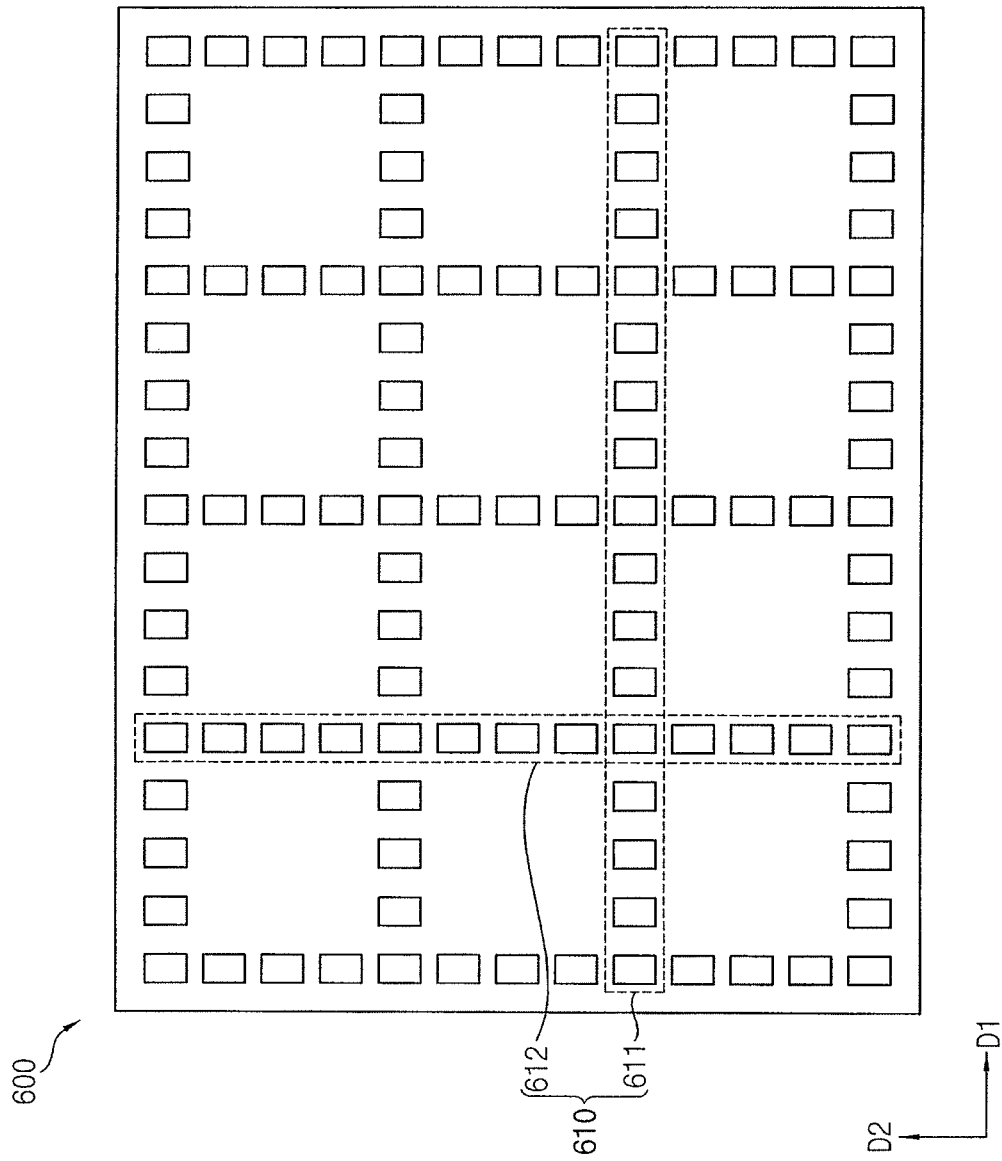
Figure 11:
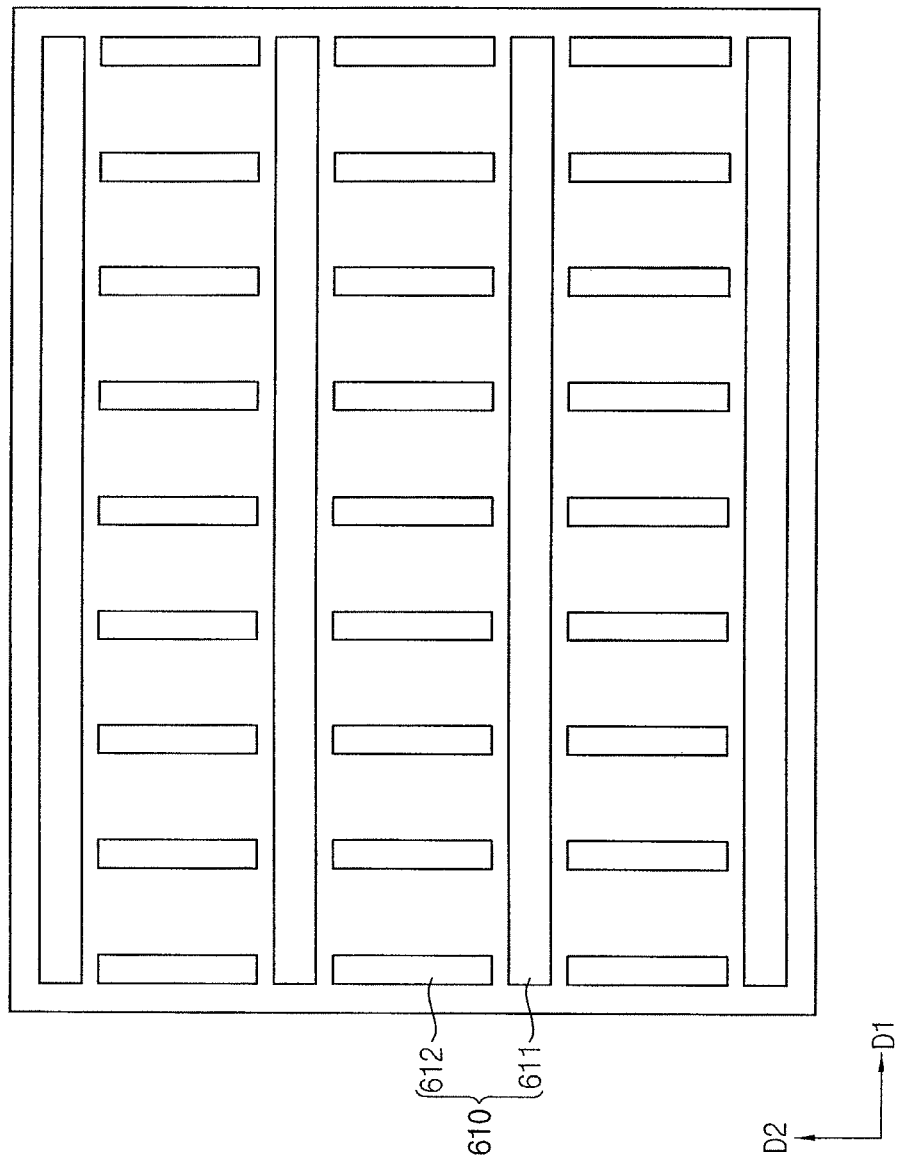
Figure 12:
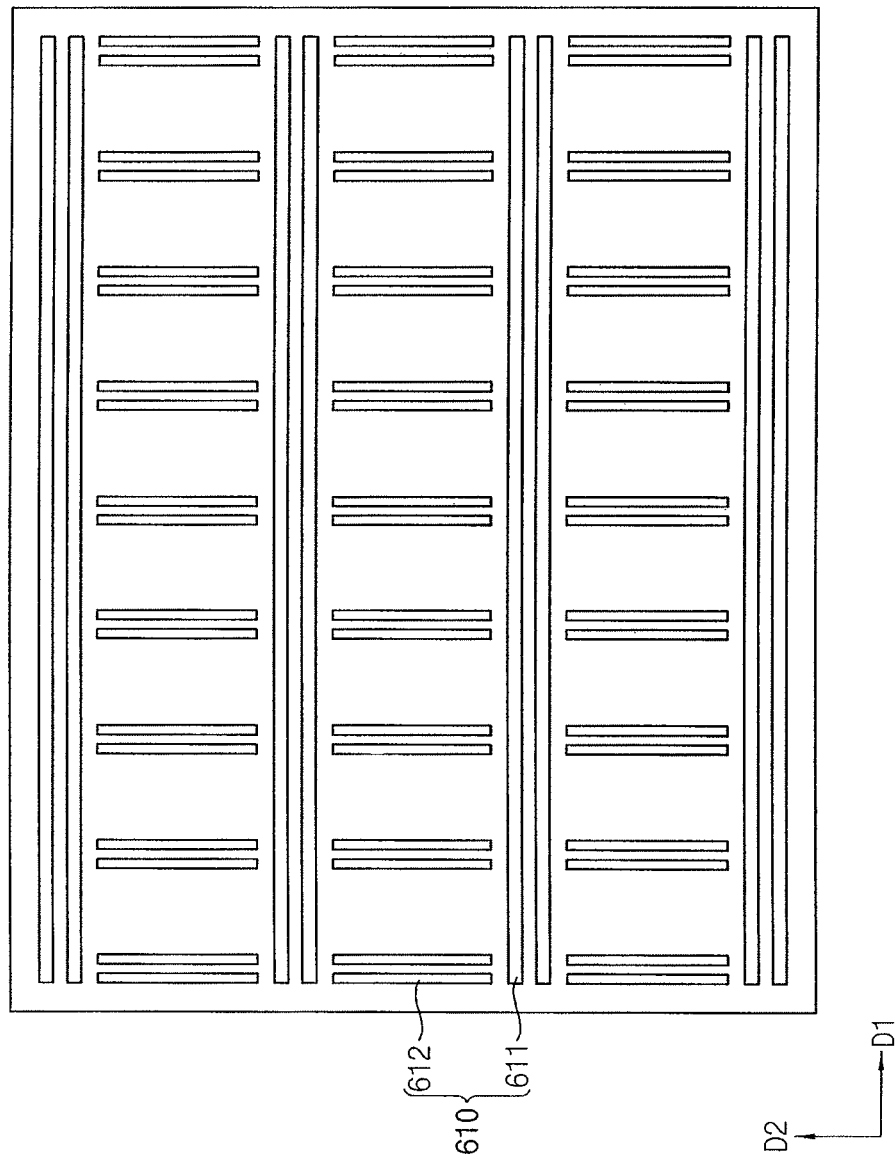

FIGS. 1 through 19 illustrate cross-sectional views of stages in a method of manufacturing an organic light emitting display device in accordance with example embodiments. FIG. 2 is a cross-sectional view taken along lines I-I' of FIG. 1, and FIG. 3 is an enlarged cross-sectional view corresponding to region 'A' of FIG. 2. FIG. 4 is a plan view illustrating a top protection film, and FIG. 5 is a plan view illustrating an example of a top protection film. FIG. 6 is a plan view illustrating another example of a top protection film, and FIG. 8 is a cross-sectional view taken along lines I-I' of FIG. 7. FIG. 10 is a plan view illustrating a top protection film, and FIG. 11 is a plan view illustrating an example of a top protection film. FIG. 12 is a plan view illustrating another example of a top protection film.

Referring to FIGS. 1, 2, and 3, a rigid glass substrate 105 may be provided. A first organic layer 111 may be formed on the entire rigid glass substrate 105. The first organic layer 111 may be formed using organic materials having flexibility. In an example embodiment, the first organic layer 111 may include polyimide. The first organic layer 111 may include, for example, a random copolymer or a block copolymer. The first organic layer 111 may have a relatively high transparency, a relatively low coefficient of thermal expansion, and a relatively high glass transition temperature. In the case where the first organic layer 111 includes imide, the first organic layer 111 may have relatively high heat resistance, relatively high chemical resistance, and relatively high abrasion resistance characteristics.

A first barrier layer 112 may be formed on the entire first organic layer 111. The first barrier layer 112 may block moisture or water that is permeated through the first organic layer 111. The first barrier layer 112 may be formed using inorganic materials having flexibility. For example, the first barrier layer 112 may include silicon oxide (SiO), silicon nitride (SiN), silicon oxynitride (SiON), silicon oxycarbide (SiOC), silicon carbon nitride (SiCN), aluminum oxide (AlO), aluminum nitride (AlN), tantalum oxide (TaO), hafnium oxide (HfO), zirconium oxide (ZrO), titanium oxide (TiO), etc.

A second organic layer 113 may be formed on the entire first barrier layer 112. The first barrier layer 112 may be formed using organic materials having flexibility. In an example embodiment, the second organic layer 113 may include polyimide. The second organic layer 113 may include, for example, a random copolymer or a block copolymer.

A second barrier layer 114 may be formed on the entire second organic layer 113. The second organic layer 113 may block moisture or water that is permeated through the second barrier layer 114. The second barrier layer 114 may be formed using inorganic materials having flexibility. In an example embodiment, the second barrier layer 114 may include SiO, SiN, etc., e.g., materials described above for the first barrier layer 112.

Accordingly, a lower substrate 110 including the first organic layer 111, the first barrier layer 112, the second organic layer 113, and the second barrier layer 114 may be formed.

In an example embodiment, the lower substrate 110 may include four layers. In another example embodiment, the substrate 110 may include a single layer or at least two layers.

In the case where the lower substrate 110 is relatively thin and flexible, the lower substrate 110 may be formed on the rigid glass substrate 105 to help support the formation of an upper structure (e.g., a semiconductor element and the light emitting structure, etc.) and, after the upper structure is formed on the lower substrate 110, the rigid glass substrate 105 may be removed. It may be difficult to directly form the upper structure on the first and second organic layers 111 and 113 and the first and second barrier layers 112 and 114 in the case where the first and second organic layers 111 and 113 and the first and second barrier layers 112 and 114 are relatively thin and flexible. Accordingly, the upper structure may be formed on the substrate 110 and the rigid glass substrate 105, and then the first and second organic layers 111 and 113 and the first and second barrier layers 112 and 114 may serve as the lower substrate 110 after the removal of the rigid glass substrate 105.

In an example embodiment, the lower substrate 110 may include transparent or opaque materials. For example, the lower substrate 110 may include a quartz substrate, a synthetic quartz substrate, a calcium fluoride substrate, a fluoride-doped quartz substrate, a soda-lime glass substrate, a non-alkali glass substrate etc. In an example embodiment, the rigid glass substrate 105 may not be provided.

A buffer layer may be formed on the lower substrate 110. The buffer layer may prevent the diffusion of metal atoms and/or impurities from the lower substrate 110 into the upper structure. In addition, the buffer layer may control a rate of a heat transfer in a crystallization process for forming an active layer, thereby obtaining substantially uniform active layer. Further, the buffer layer may improve a surface flatness of the lower substrate 110 when a surface of the lower substrate 110 is relatively irregular. According to a type of the lower substrate 110, at least two buffer layers may be provided on the lower substrate 110, or the buffer layer may not be formed. For example, the buffer layer may be formed using organic materials or inorganic materials.

As illustrated in FIG. 1, display structures 300 may be formed on the lower substrate 110 in a lattice shape, and may be spaced apart from each other. Thus, the display structures 300 may be entirely arranged in a first direction D1 and a second direction D2. Here, the first direction D1 may be in parallel to an upper surface of the lower substrate 110, and the second direction D2 may be parallel to the upper surface of the lower substrate 110 and perpendicular to the first direction D1. Each display structure 300 may correspond, for example, to a display panel having a plurality of pixels. As described below, the display structures 300 may be separated from each other by performing a cutting process that divides the lower substrate 110 into sections.

Each of the display structures 300 may have a structure, for example, as described below and illustrated in FIG. 3.

As illustrated in FIGS. 2 and 3, an active layer 130 may be formed on the lower substrate 110. The active layer 130 may be formed using a metal oxide semiconductor, an inorganic semiconductor (e.g., amorphous silicon, polysilicon, etc.), an organic semiconductor, etc. The active layer 130 may have a source region and a drain region.

A gate insulation layer 150 may be formed on the active layer 130. The gate insulation layer 150 may cover the active layer 130 on the lower substrate 110, and may extend in the first direction D1 on the lower substrate 110. The gate insulation layer 150 may sufficiently cover the active layer 130 on the lower substrate 110, and may have a substantially flat upper surface without a step around the active layer 130. Alternatively, the gate insulation layer 150 may cover the active layer 130 on the lower substrate 110, and may be formed as a substantially uniform thickness along a profile of the active layer 130. The gate insulation layer 150 may be formed using silicon compound, metal oxide, etc. In an example embodiment, the gate insulation layer 150 may have a multi-layered structure including a plurality of insulation layers. For example, the insulation layers may have different thicknesses to each other or include different materials to each other.

A gate electrode 170 may be formed on the gate insulation layer 150. The gate electrode 170 may be formed on a portion of the gate insulation layer 150 under which the active layer 130 is located. The gate electrode 170 may be formed using a metal, a metal alloy, metal nitride, conductive metal oxide, transparent conductive materials, etc. For example, the gate electrode 170 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy of aluminum, aluminum nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SRO), zinc oxide (ZnO), indium tin oxide (ITO), stannum oxide (SnO), indium oxide (InO), gallium oxide (GaO), indium zinc oxide (IZO), etc. These may be used alone or in a suitable combination thereof. In an example embodiment, the gate electrode 170 may have a multi-layered structure including a plurality of layers.

An insulating interlayer may be formed on the gate electrode 170. The insulating interlayer 190 may cover the gate electrode 170 on the gate insulation layer 150, and may extend in the first direction D1 on the gate insulation layer 150. The insulating interlayer 190 may sufficiently cover the gate electrode 170 on the gate insulation layer 150, and may have a substantially flat upper surface without a step around the first gate electrode 170. Alternatively, the insulating interlayer 190 may cover the gate electrode 170 on the gate insulation layer 150, and may be formed as a substantially uniform thickness along a profile of the gate electrode 170. The insulating interlayer 190 may be formed using silicon compound, metal oxide, etc. In an example embodiment, the insulating interlayer 190 may have a multi-layered structure including a plurality of insulation layers. The insulation layers may have different thicknesses to each other or include different materials to each other.

A source electrode 210 and a drain electrode 230 may be formed on the insulating interlayer 190. The source electrode 210 may be connected to the source region of the active layer 130 via a contact hole formed by removing a first portion of the gate insulation layer 150 and the insulating interlayer 190. The drain electrode 230 may be connected to the drain region of the active layer 130 via a contact hole formed by removing a second portion of the gate insulation layer 150 and the insulating interlayer 190. Each of the source electrode 210 and the drain electrode 230 may include a metal, an alloy, metal nitride, conductive metal oxide, transparent conductive materials, etc. These may be used alone or in a suitable combination thereof. In an example embodiment, each of the source and drain electrodes 210 and 230 may have a multi-layered structure including a plurality of layers.

Accordingly, a semiconductor element 250 including the active layer 130, the gate insulation layer 150, the gate electrode 170, the insulating interlayer 190, the source electrode 210, and the drain electrode 230 may be formed.

As illustrated, the semiconductor element 250 has a top gate structure, but the semiconductor element 250 may have a bottom gate structure, etc.

In addition, an OLED device may include one semiconductor element, or may include at least one semiconductor element and at least one capacitor, etc.

A planarization layer 270 may be formed on the insulating interlayer 190, the source electrode 210, and the drain electrode 230. The planarization layer 270 may cover the source and drain electrodes 210 and 230 on the insulating interlayer 190. The planarization layer 270 may be formed as a relatively high thickness. In this case, the planarization layer 270 may have a substantially flat upper surface, and a planarization process may be further performed on the planarization layer 270 to implement the flat upper surface of the planarization layer 270. Alternatively, the planarization layer 270 may be formed as a substantially uniform thickness along a profile of the source and drain electrodes 210 and 230 on the insulating interlayer 190. The planarization layer 270 may include organic materials or inorganic materials. In an example embodiment, the planarization layer 270 may be formed using organic materials. For example, the planarization layer 270 may include a photoresist, a polyacryl-based resin, a polyimide-based resin, a polyamide-based resin, a siloxane-based resin, an acryl-based resin, or an epoxy-based resin, etc.

A lower electrode 290 may be formed on the planarization layer 270. The lower electrode 290 may be connected to the drain electrode 230 via a contact hole formed by removing a portion of the planarization layer 270. In addition, the lower electrode 290 may be electrically connected to the semiconductor element 250. The lower electrode 290 may be formed using a metal, a metal alloy, metal nitride, conductive metal oxide, transparent conductive materials, etc. These may be used alone or in a suitable combination thereof. In an example embodiment, the lower electrode 290 may have a multi-layered structure including a plurality of layers.

A pixel defining layer 310 may be formed on the planarization layer 270. The pixel defining layer 310 may cover both lateral portions of the lower electrode 290, and may expose a portion of an upper surface of the lower electrode 290. The pixel defining layer 310 may include organic materials or inorganic materials. In an example embodiment, the pixel defining layer 310 may be formed using organic materials.

A light emitting layer 330 may be formed on the lower electrode 290. The light emitting layer 330 may have a multi-layered structure including an organic light emission layer ("EML"), a hole injection layer ("HIL"), a hole transport layer ("HTL"), an electron transport layer ("ETL"), an electron injection layer ("EIL"), etc. The EML of the light emitting layer 330 may be formed using at least one of light emitting materials capable of generating a colored light (e.g., a red color of light, a blue color of light, and a green color of light, etc.) according to sub-pixels. In an example embodiment, the EML of the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330 that is located on the lower electrode 290. The color filter may include at least one selected from a red color filter, a green color filter, and a blue color filter. In an example embodiment, the color filter may include at least one selected from a yellow color filter, a cyan color filter, and a magenta color filter. The color filter may include a photosensitive resin, a color photoresist, etc.

An upper electrode 340 may be formed on the light emitting layer 330 and the pixel defining layer 310, and may extend in the first direction D1. The upper electrode 340 may be formed using a metal, a metal alloy, metal nitride, conductive metal oxide, transparent conductive materials, etc. These may be used alone or in a suitable combination thereof. In an example embodiment, the upper electrode 340 may have a multi-layered structure including a plurality of layers.

Accordingly, a light emitting structure 200 including the lower electrode 290, the light emitting layer 330, and the upper electrode 340 may be formed.

A first TFE layer 451 may be formed on the upper electrode 340. The first TFE layer 451 may cover the upper electrode 340, and may be formed as a substantially uniform thickness along a profile of the upper electrode 340 and extend in the first direction D1. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may be formed using inorganic materials having flexibility.

A second TFE layer 452 may be formed on the first TFE layer 451. The second TFE layer 452 may improve the flatness of the OLED device, and may protect the light emitting structure 200. The second TFE layer 452 may be formed using organic materials having flexibility.

A third TFE layer 453 may be formed on the second TFE layer 452. The third TFE layer 453 may cover the second TFE layer 452, and may be formed as a substantially uniform thickness along a profile of the second TFE layer 452 and extend in the first direction D1. The third TFE layer 453 together with the first TFE layer 451 may prevent the light emitting structure 200 from being deteriorated by the permeation of moisture, water, oxygen, etc. In addition, the third TFE layer 453 together with the first and second TFE layers 451 and 452 may protect the light emitting structure 200 from external impacts. The third TFE layer 453 may be formed using inorganic materials having flexibility.

Accordingly, a TEE structure 450 including the first TFE layer 451, the second TFE layer 452, and the third TFE layer 453 may be formed. In an example embodiment, the TFE structure 450 may have, for example, five layers structure where first to fifth TFE layers are stacked or seven layers structure where first to seventh TFE layers are stacked.

The display structures 300 including the semiconductor element 250, the planarization layer 270, the pixel defining layer 310, the light emitting structure 200, and the TFE structure may be formed on the lower substrate 110, and may be spaced apart from each other.

Figure 7:
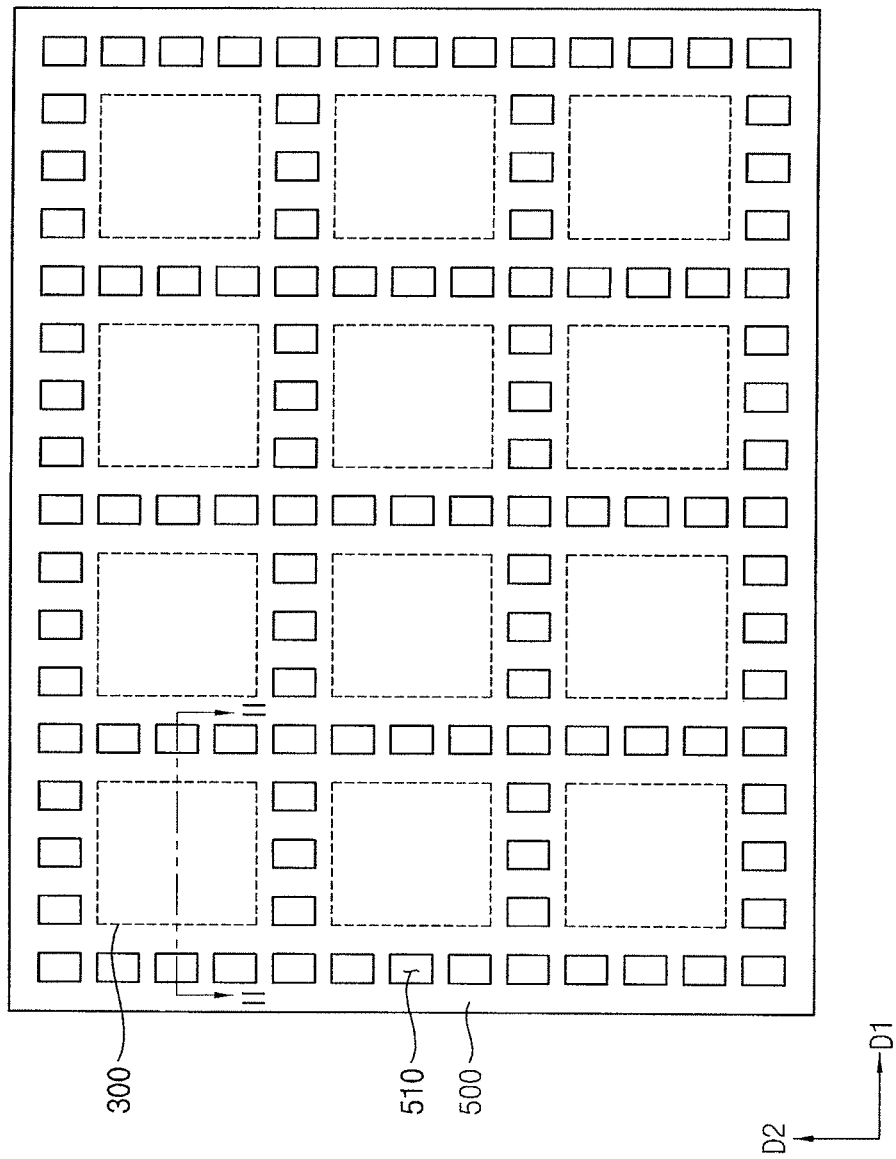
Figure 8:
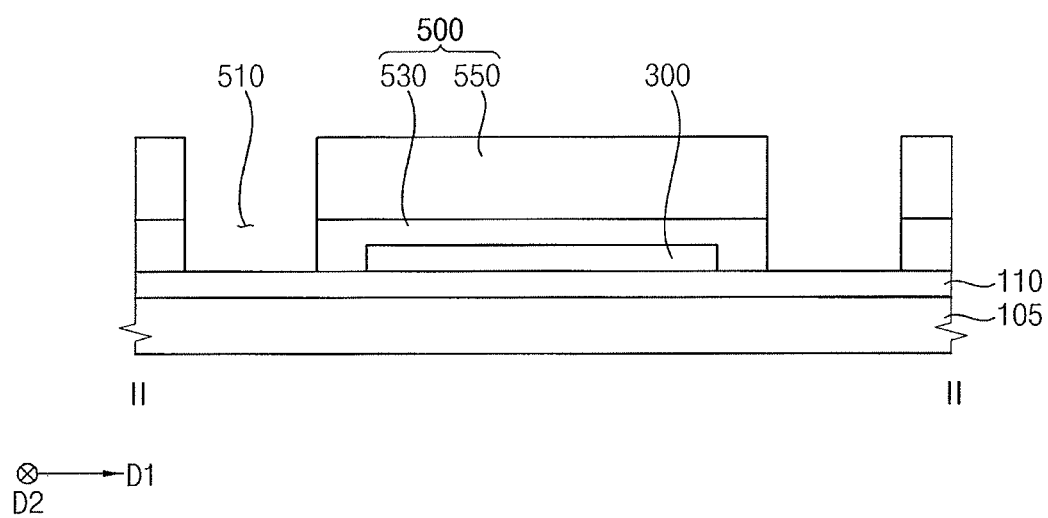

Referring to FIGS. 4, 7, and 8, a top protection film 500 may be provided. The top protection film 500 may include an adhesive layer 530 and a protection layer 550, and a plurality of top opening patterns 510 may be formed in the top protection film 500. As illustrated in FIGS. 7 and 8, the top protection film 500 may be entirely formed on the lower substrate 110 and the display structures 300. For example, the adhesive layer 530 may be in contact with the lower substrate 110 (see, e.g., FIG. 8), and the protection layer 550 may be formed on the adhesive layer 530. The top protection film 500 may be formed to protect the lower substrate 110 and the display structures 300 from external impacts and/or pollutants generated in a manufacturing process of the OLED device. The top protection film 500 may sufficiently cover the display structures 300 on the lower substrate 110, and may have a substantially flat upper surface without a step around the display structures 300. Alternatively, the top protection film 500 may cover the display structures 300 on the lower substrate 110, and may be formed as a substantially uniform thickness along a profile of the display structures 300. The adhesive layer 530 may be formed using urethane-based adhesives, acrylic-based adhesives, silicon-based adhesives, etc. The protection layer 550 may include polyethylene terephthalate ("PET"), polyethylene naphthalene ("PEN"), polypropylene ("PP"), polycarbonate ("PC"), polystyrene ("PS"), polysulfone ("PSul"), polyethylene ("PE"), polyphthalamide ("PPA"), polyethersulfone ("PES"), polyarylate ("PAR"), polycarbonate oxide ("PCO"), modified polyphenylene oxide ("MPPO"), etc.

In an example embodiment, the top opening patterns 510 may surround each of the display structures 300. Thus, each of the display structures 300 may be encircled by the top opening patterns 510.

The top opening patterns 510 may include, for example, first top opening patterns 511 arranged in the first direction D1 and second top opening patterns 512 arranged in the second direction D2. The first top opening patterns 511 arranged in the first direction D1 may be spaced apart from each other by a predetermined distance in the second direction D2, and may be repeatedly arranged. The second top opening patterns 512 arranged in second direction D2 may be spaced apart from each other by a predetermined distance in the first direction D1, and may be repeatedly arranged. Further, the first top opening patterns 511 and the second top opening patterns 512 may intersect each other.

Each of the display structures 300 may be located in a respective one of a plurality of spaces that are defined by the first top opening patterns 511 and the second top opening patterns 512.

In other implementations, the top opening patterns 510 may include only the first top opening patterns 511 or only the second top opening patterns 512.

In various example embodiments, the first top opening patterns 511 may be integrally formed and the second top opening patterns 512 may be integrally formed, as illustrated in FIG. 5, or, as illustrated in FIG. 6, each of the first top opening patterns 511 that are integrally formed and the second top opening patterns 512 that are integrally formed may be formed with a relatively reduced width and two or more top opening patterns 510 may be formed between adjacent two display structures 300 among the display structures 300.

In a process for forming the top protection film 500 on the lower substrate 110, bubbles may be generated between the lower substrate 110 and the top protection film 500. Where the display structures 300 are formed on the lower substrate 110, a step may be formed in a portion where each of the lower substrate 110 and the display structures 300 are formed. The bubbles may be generated between an outer portion of each of the display structures 300 on the lower substrate 110 and the adhesive layer 530 (e.g., the portion where the step is formed), and a size of the bubbles may be increased in a manufacturing process of the OLED device. In this case, a defect of a cutting process may occur due to the bubbles during the cutting process for cutting the lower substrate 110 (performed subsequently) or when an image quality is checked.

In accordance with an example embodiment, the top protection film 500 including the top opening patterns 510 is used in a manufacturing process of the OLED device. Thus, the bubbles may escape through the top opening patterns 510. Thus, the top opening patterns 510 may be used as a path for removing the bubbles generated between the lower substrate 110 and the top protection film 500. Accordingly, a defect by the bubbles may be avoided in a subsequent process.

Figure 9:
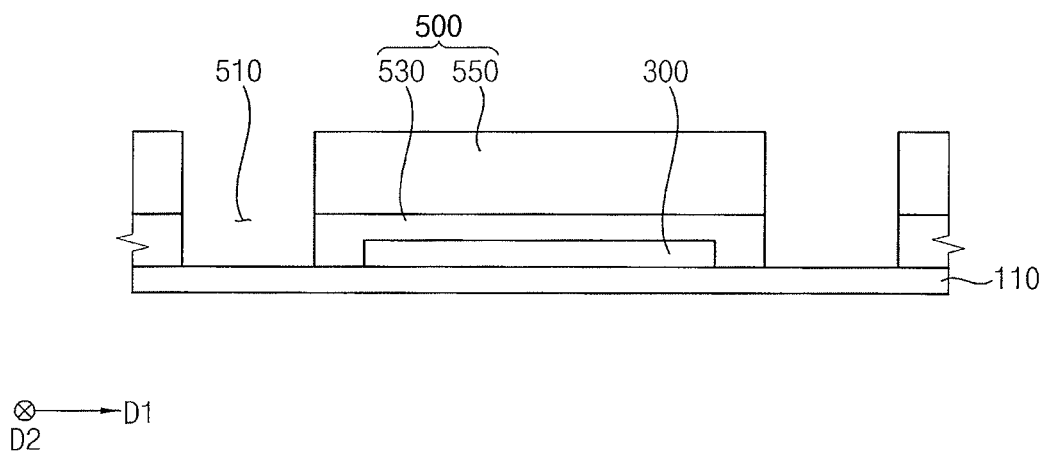

Referring to FIG. 9, after the top protection film 500 is formed, the rigid glass substrate 105 may be removed (or separated) from the lower substrate 110. For example, the lower substrate 110 and the rigid glass substrate 105 may be separated by irradiating a laser in an adhesive surface of the lower substrate 110 and the rigid glass substrate 105. In this case, particles that may be generated in the separation process may remain in a lower surface of the lower substrate 110, and the lower surface of the lower substrate 110 may be uneven.

Figure 13:
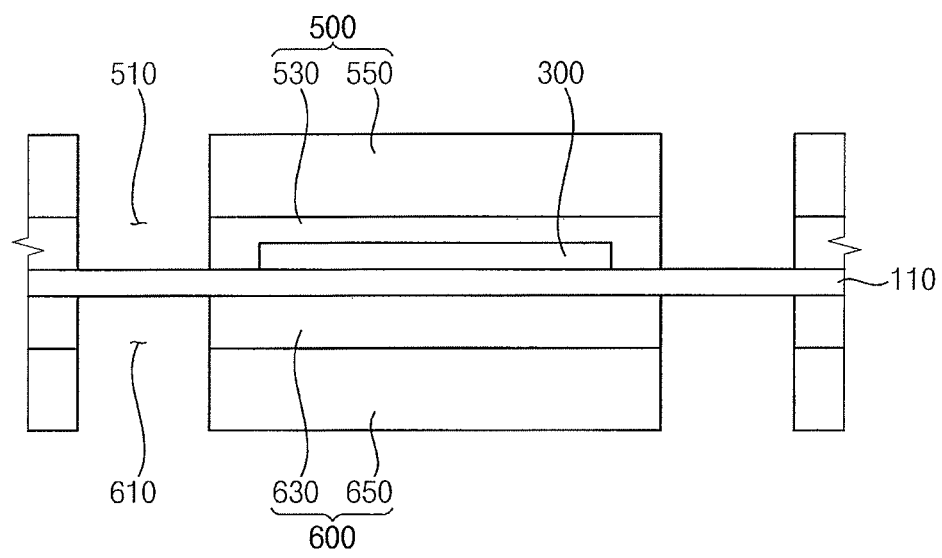

Referring to FIGS. 10 and 13, a bottom protection film 600 may be provided. The bottom protection film 600 may include an adhesive layer 630 and a protection layer 650, and a plurality of bottom opening patterns 610 may be formed in the bottom protection film 600. The bottom protection film 600 may be entirely formed on a lower surface of the lower substrate 110. For example, the adhesive layer 630 may be in contact with the lower substrate 110, and the protection layer 650 may be formed on the adhesive layer 630. The bottom protection film 600 may be formed to protect the lower substrate 110 and the display structures 300 from external impacts and/or pollutants that may be generated in a manufacturing process of the OLED device. The bottom protection film 600 may sufficiently cover the particles on the lower surface of the lower substrate 110, and may have a substantially flat upper surface without a step around the particles. Alternatively, the bottom protection film 600 may cover the particles on the lower surface of the lower substrate 110, and may be formed as a substantially uniform thickness along a profile of the particles. The adhesive layer 630 may be formed using urethane-based adhesives, acrylic-based adhesives, silicon-based adhesives, etc. The protection layer 650 may include PET, PEN, PP, PC, PS, PSul, PE, PPA, PES, PAR, PCO, MPPO, etc. Thus, the bottom protection film 600 and the top protection film 500 may include the same materials.

In an example embodiment, the bottom opening patterns 610 may include first bottom opening patterns 611 arranged in the first direction D1 and second bottom opening patterns 612 arranged in the second direction D2. In addition, the first bottom opening patterns 611 may overlap the first top opening patterns 511, and the second bottom opening patterns 612 may overlap the second top opening patterns 512. In an example embodiment, the bottom opening patterns 610 may include only the first bottom opening patterns 611 or only the second bottom opening patterns 612.

In an example embodiment, each of the first bottom opening patterns 611 and the second bottom opening patterns 612 may be integrally formed as illustrated in FIG. 11, and the second bottom opening patterns 612 may have the relatively large number, compared to FIG. 5. For example, because the display structures 300 are not formed in a lower surface of the lower substrate 110, the second bottom opening patterns 612 may be located to overlap the display structures 300. In an example embodiment, each of the first bottom opening patterns 611 that are integrally formed and the second bottom opening patterns 612 that are integrally formed may be formed with a relatively reduced width, and two or more bottom opening patterns 610 may be formed to overlap between adjacent two display structures 300 among the display structures 300, as illustrated in FIG. 12, and the second bottom opening patterns 612 may have a relatively larger number, compared to FIG. 6. For example, because the display structures 300 are not formed in the lower surface of the lower substrate 110, the second bottom opening patterns 612 may be located to overlap the display structures 300. In another example embodiment, a location of the top opening patterns 510 may be different from a location of the bottom opening patterns 610, and a shape of top opening patterns 510 may be different from a shape of the bottom opening patterns 610.

In a process for forming the bottom protection film 600 on the lower surface of the lower substrate 110, bubbles may be generated between the lower substrate 110 and the bottom protection film 600. For example, as the particles are formed on the lower surface of the lower substrate 110, a step may be formed in a portion where each of particles is formed, and the bubbles may be generated between the particles and the adhesive layer 630. Further, a size of the bubbles may be increased in a manufacturing process of the OLED device. In this case, a defect of a cutting process may occur due to the bubbles when the cutting process for cutting the lower substrate 110, which is subsequently performed, is performed (or an image quality is checked).

In an example embodiment, the bottom protection film 600 including the bottom opening patterns 610 may be used in a manufacturing process of the OLED device. Thus, the bubbles may escape through the bottom opening patterns 610. Thus, the bottom opening patterns 610 may be used as a path for removing the bubbles generated between the lower substrate 110 and the particles. Accordingly, a defect by the bubbles may be avoided in a subsequent process.

Figure 14:
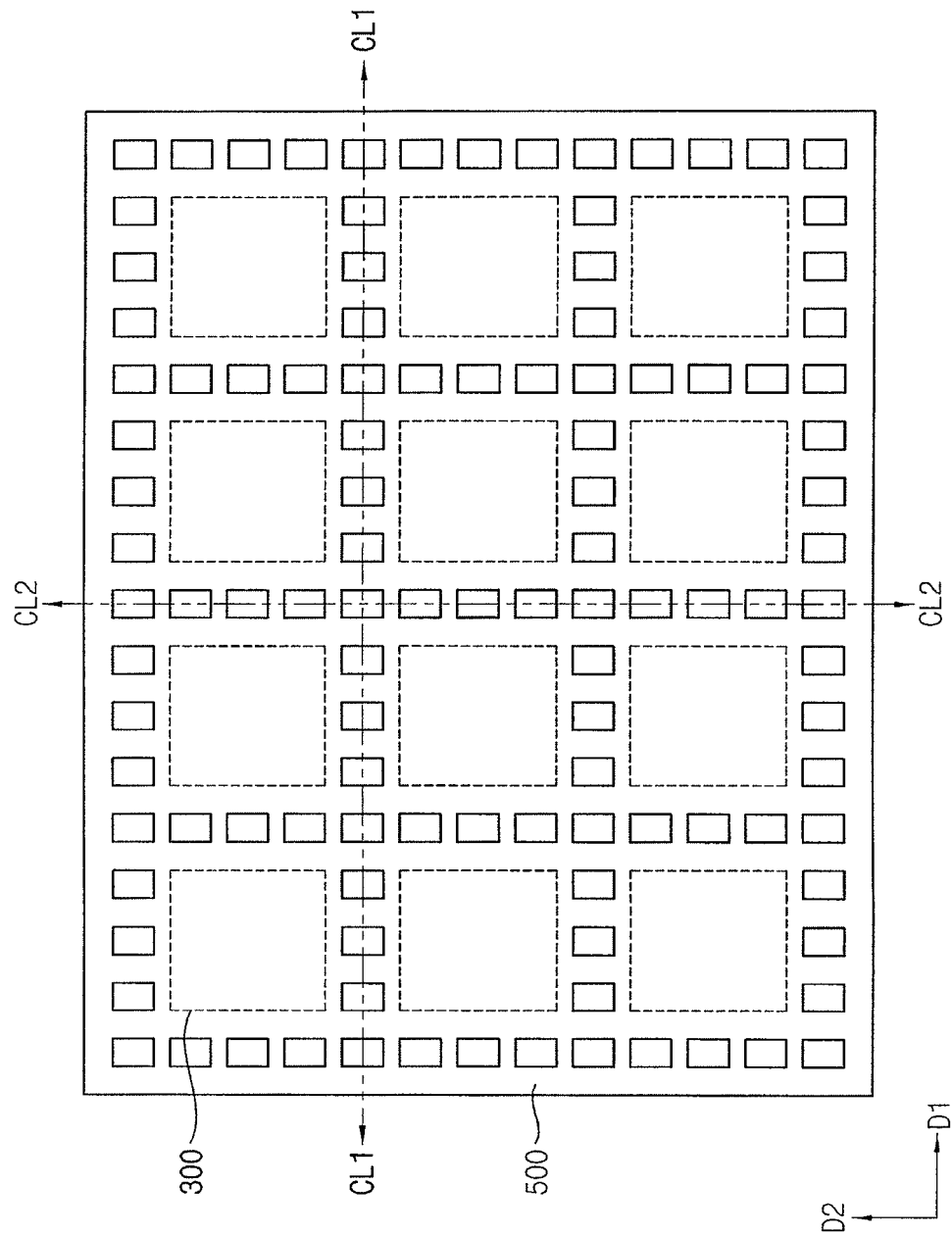

Referring to FIG. 14, the lower substrate 110 may be cut along first cutting lines CL1 located to overlap the first top opening patterns 511 (e.g., a cutting process). After the lower substrate 110 is cut along the first cutting lines CL1, the lower substrate 110 may be cut along second cutting lines CL2 that is perpendicular to the first cutting lines CL1. Here, the second cutting lines CL2 may be located to overlap the second top opening patterns 512.

In addition, the first cutting lines CL1 may be located to overlap the first bottom opening patterns 611, and the second cutting lines CL2 may be located to overlap the second bottom opening patterns 612.

In an example embodiment, the first cutting lines CL1 may overlap the first top opening patterns 511 and the first bottom opening patterns 611, and the second cutting lines CL2 may overlap the second top opening patterns 512 and the second bottom opening patterns 612 in a manufacturing process of the OLED device. Thus, the bubbles may not be present along the first and second cutting lines CL1 and CL2 in the cutting process. Accordingly, a defect caused by bubbles may be avoided in the cutting process.

Figure 15:
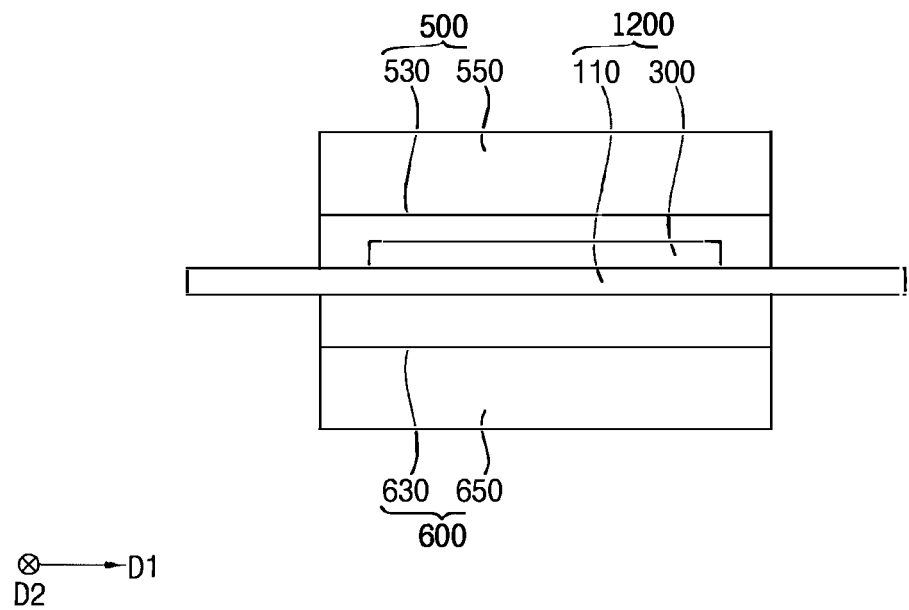

Referring to FIG. 15, after the cutting process is performed, the display structures 300 may be separated from each other. As an example, FIG. 15 illustrates one display structure 300 among the display structures 300. Here, a configuration including a portion of the lower substrate 110 and the display structures 300 may be defined as a display panel 1200. Thus, after the cutting process is performed, a plurality of display panels 1200 may be formed.

Figure 16:
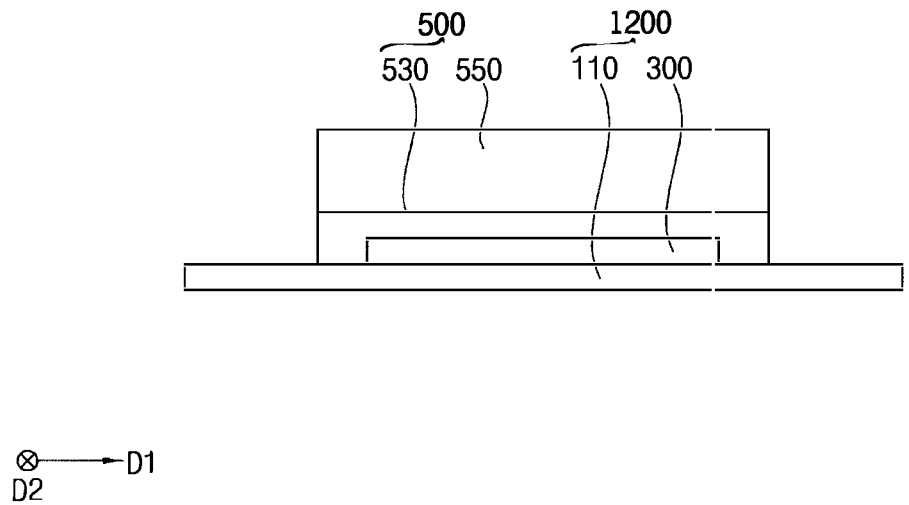
Figure 17:
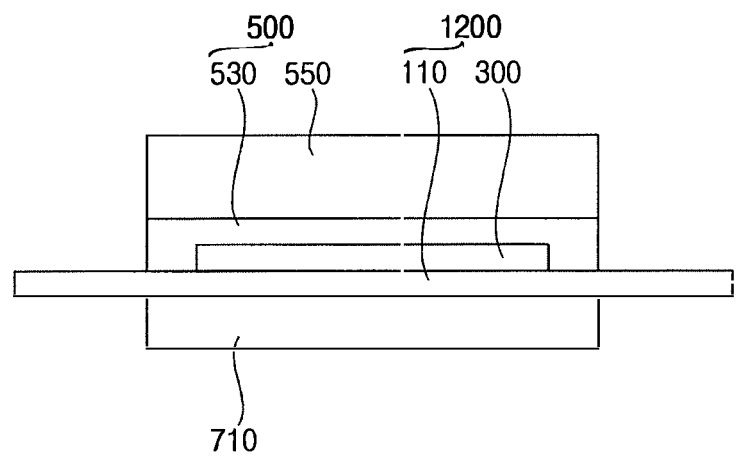

Referring to FIGS. 16 and 17, the bottom protection film 600 located in a lower surface of the display panel 1200 (or a lower surface of the lower substrate 110) may be removed. After the bottom protection film 600 is removed, a pattern film 710 may be formed in the lower surface of the display panel 1200.

For example, when the OLED device has a bending region, the pattern film 710 may be patterned such that a portion of the lower surface of the display panel 1200 is exposed. In addition, the pattern film 710 may include an adhesive layer and a protection layer. The lower substrate 110 and the protection layer may adhere through the adhesive layer. Further, the adhesive layer may be formed using optical clear adhesives ("OCA"), pressure sensitive adhesives ("PSA"), etc. including urethane-based adhesives, acrylic-based adhesives, silicon-based adhesives, rubber-based adhesives, vinyl ether-based adhesives, etc. In addition, an antistatic material may be added in the OCA or the PSA. The protection layer may include PET, PEN, PP, PC, PS, PSul, PE, PPA, PES, PAR, PCO, MPPO, etc.

Figure 18:
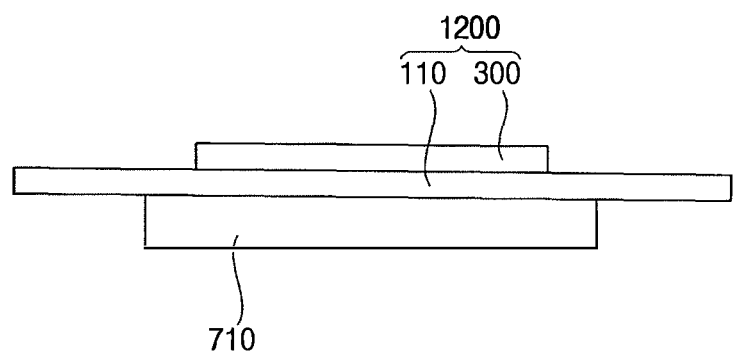
Figure 19:
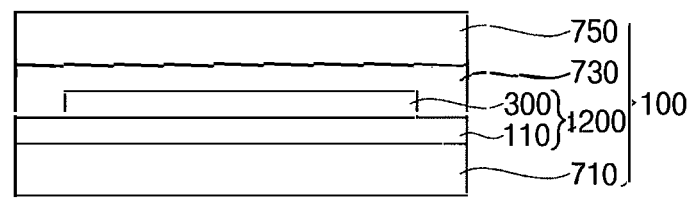

Referring to FIGS. 18 and 19, the top protection film 500 located on the display panel 1200 may be removed. After the top protection film 500 is removed, a touch screen electrode layer 730 and a polarizing layer 750 may be formed. Here, the polarizing layer 750 may be formed on the touch screen electrode layer 730. In another example embodiment, the polarizing layer 750 may be formed on the display panel 1200, and the touch screen electrode layer 730 may be formed on the polarizing layer 750.

The touch screen electrode layer 730 may be formed on the TFE structure 450 (or display panel 1200). The touch screen electrode layer 730 may include a bottom film, touch screen electrodes, and a top film, etc. The bottom film and the top film may protect the touch screen electrodes. Each of the bottom and top films may include PET, PEN, PP, PC, PS, PSul, PE, PPA, PES, PAR, PCO, MPPO, etc. The touch screen electrodes may substantially have a metal mesh structure. For example, the touch screen electrodes may include carbon nanotube (CNT), transparent conductive oxide (TCO), ITO, indium gallium zinc oxide (IGZO), ZnO, graphene, silver nanowire (AgNW), Cu, Cr, etc. In another example embodiment, the touch screen electrodes may be formed directly on the TFE structure 450. In this case, the bottom film might not be formed on the TFE structure 450.

The polarizing layer 750 may be formed on the touch screen electrode layer 730. The polarizing layer 750 may include a linearly polarized film and a $\lambda/4$ phase retardation film. Here, the $\lambda/4$ phase retardation film may be formed on the touch screen electrode layer 730. The $\lambda/4$ phase retardation film may convert a phase of the light. For example, the $\lambda/4$ phase retardation film may convert the light vibrating up and down or the light vibrating left and right into right-circularly polarized light or left-circularly polarized light, respectively. In addition, the $\lambda/4$ phase retardation film may convert the right-circularly polarized light or the left-circularly polarized light into the light vibrating up and down or the light vibrating left and right, respectively. The $\lambda/4$ phase retardation film may include a birefringent film containing polymer, an orientation film of a liquid crystal polymer, alignment layer of a liquid crystal polymer, etc.

The linearly polarized film may be disposed on the $\lambda/4$ phase retardation film. The linearly polarized film may selectively transmit the incident light. For example, the linearly polarized film may transmit the light vibrating up and down or vibrating left and right. In this case, the linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down.

The light transmitting the linearly polarized film may transmit the $\lambda/4$ phase retardation film. As described above, the $\lambda/4$ phase retardation film may convert a phase of the light. For example, when the incident light vibrating up, down, left, and right passes through the linearly polarized film, the linearly polarized film including a pattern of the horizontal stripes may transmit the light vibrating left and right. When the incident light vibrating left and right passes through the $\lambda/4$ phase retardation film, the incident light vibrating left and right may be converted into the left-circularly polarized light. The incident light including the left-circularly polarized light may be reflected at the cathode electrode (e.g., the upper electrode 340) of the light emitting structure 200, and then the incident light may be converted into the right-circularly polarized light. When the incident light including the right-circularly polarized light passes through the $\lambda/4$ phase retardation film, the incident light may be converted into the light vibrating up and down. Here, the light vibrating up and down may be blocked by the linearly polarized film including a pattern of the horizontal stripes. Accordingly, the incident light may be removed by the linearly polarized film and the $\lambda/4$ phase retardation film (i.e., the polarizing layer 750). For example, the linearly polarized film may include iodine-based materials, materials containing dye, polyene-based materials, etc. Accordingly, the upper structure 400 including the touch screen electrode layer 410 and the polarizing layer 750 may be disposed.

After the polarizing layer 750 is formed, both lateral portions of the lower substrate 110 may be fully cut. Accordingly, an OLED device 100 including the display panel 1200, the pattern film 710, the touch screen electrode layer 730, and the polarizing layer 750 may be manufactured.

Example embodiments may be applied to a method of manufacturing various display devices including an OLED device. For example, the example embodiments may be applied to a method of manufacturing various display devices such as vehicle-display device, a ship-display device, an aircraft-display device, portable communication devices, display devices for display or for information transfer, a medical-display device, etc.

By way of summation and review, when manufacturing an OLED device, a plurality of display structures may be formed on a lower substrate in a matrix shape (or a lattice shape) after the lower substrate is formed on a rigid glass substrate, and may be spaced apart from each other. For example, a plurality of pixel circuits, a plurality of pixels, and a TFE structure may be formed in each display structure among the plurality of display structures, and the lower substrate, the pixel circuits, the pixels, and the TFE structure may be defined as one display panel. Thus, a plurality of display panels may share one the lower substrate until the display panels are manufactured as individual display panels by performing a cutting process, which is subsequently performed, of the OLED device.

After the display structures are formed, a top protection film may be formed on the display structures and the lower substrate. The rigid glass substrate may be removed after the top protection film is formed, and then a bottom protection film may be formed on a lower surface of the lower substrate. The top and bottom protection films may be formed to protect the display structures from external impacts and/or pollutants that may be generated in the manufacturing process of the OLED device. However, in a process for forming the top and bottom protection films, bubbles may be generated in a portion located adjacent to an outer portion of the display structure on the lower substrate and between the top and bottom protection films, and a defect of the cutting process may occur due to the bubbles when the cutting process is performed (or an image quality is checked).

As described above, embodiments relate to a method of manufacturing an organic light emitting display device using a protection film including opening patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light emitting display device, the method comprising:
    forming a plurality of display structures on a lower substrate;
    forming a top protection film, the top protection film including a plurality of top opening patterns on the lower substrate and the display structures such that the top opening patterns do not overlap the display structures and expose a portion of the lower substrate in a plan view, the plurality of top opening patterns being spaced apart from each other;
    cutting the lower substrate between two adjacent display structures among the plurality of display structures along a first cutting line that is located at at least a portion of the top opening patterns;
    separating the lower substrate to form a plurality of display panels each including the display structure and a portion of the lower substrate; and
    removing the top protection film.

2. The method as claimed in claim 1, wherein the top protection film includes:
    an adhesive layer in contact with the lower substrate; and
    a protection layer formed on the adhesive layer.

3. The method as claimed in claim 1, wherein the top opening patterns surround each of the display structures.

4. The method as claimed in claim 1, wherein the top opening patterns include:
    first top opening patterns arranged along a first direction that is parallel to an upper surface of the lower substrate; and
    second top opening patterns arranged along a second direction that is parallel to the upper surface of the lower substrate and perpendicular to the first direction.

5. The method as claimed in claim 4, wherein extending directions of the first top opening patterns and the second top opening patterns intersect each other, and each of the display structures is located in a plurality of spaces that are defined by the first top opening patterns and the second top opening patterns.

6. The method as claimed in claim 4, wherein the first cutting line overlaps the first top opening patterns.

7. The method as claimed in claim 6, further comprising cutting the lower substrate along a second cutting line that is perpendicular to the first cutting line.

8. The method as claimed in claim 7, wherein the second cutting line overlaps the second top opening patterns.

9. The method as claimed in claim 7, wherein the lower substrate is cut along the first and second cutting lines.

10. The method as claimed in claim 4, wherein the first top opening patterns are integrally formed, and the second top opening patterns are integrally formed.

11. The method as claimed in claim 1, wherein the display structures are spaced apart from each other on the lower substrate in a lattice arrangement.

12. The method as claimed in claim 1, wherein each of the display structures includes:
    a plurality of semiconductor elements formed on the lower substrate;
    a plurality of light emitting structures formed on the semiconductor elements; and
    a thin film encapsulation structure formed on the light emitting structures.

13. The method as claimed in claim 12, wherein the thin film encapsulation structure includes:
    a first thin film encapsulation layer formed on the light emitting structures, the first thin film encapsulation layer including inorganic materials having flexibility;
    a second thin film encapsulation layer formed on the first thin film encapsulation layer, the second thin film encapsulation layer including organic materials having flexibility; and
    a third thin film encapsulation layer formed on the second thin film encapsulation layer, the third thin film encapsulation layer including the inorganic materials having flexibility.

14. The method as claimed in claim 13, wherein, prior to forming the display structures on the lower substrate, the method further comprises:
    providing a rigid glass substrate; and
    forming the lower substrate on the rigid glass substrate.

15. The method as claimed in claim 14, wherein, after forming the top protection film including the top opening patterns, the method further comprises:
    removing the rigid glass substrate; and
    forming a bottom protection film including a plurality of bottom opening patterns on a lower surface of the lower substrate, wherein the bottom opening patterns overlap the top opening patterns, respectively.

16. The method as claimed in claim 15, wherein, after forming the display panels each including the display structure and a portion of the lower substrate, the method further comprises:
    forming a pattern film on a lower surface of each of the display panels after the bottom protection film is removed in each of the display panels; and
    forming a polarizing layer on an upper surface of each of the display panels after the top protection film is removed in each of the display panels.

17. The method as claimed in claim 1, wherein the plurality of the top opening patterns are holes.

18. A method of manufacturing an organic light emitting display device, the method comprising:

forming a plurality of display structures on a lower substrate;

forming a top protection film including a plurality of top opening patterns on the lower substrate and the display structures such that the top opening patterns do not overlap the display structures and expose a portion of the lower substrate in a plan view;

cutting the lower substrate between two adjacent display structures among the plurality of display structures along a first cutting line that is located at at least a portion of the top opening patterns; and separating the lower substrate to form a plurality of display panels each including the display structure and a portion of the lower substrate, wherein the lower substrate includes:
- a first organic layer including organic materials having flexibility;
- a first barrier layer formed on the first organic layer, the first barrier layer including inorganic materials having flexibility;
- a second organic layer formed on the first barrier layer, the second organic layer including organic materials having flexibility; and
- a second barrier layer formed on the second organic layer, the second barrier layer including inorganic materials having flexibility.

19. The method as claimed in claim 18, wherein the top opening patterns provide a path for removing bubbles formed between the top protection film and the lower substrate.

20. A method of manufacturing an organic light emitting display device, the method comprising:

forming a plurality of display structures on a lower substrate;

forming a top protection film, the top protection film including a plurality of top opening patterns on the lower substrate and the display structures such that the top opening patterns do not overlap the display structures, the plurality of top opening patterns being spaced apart from each other, wherein the top opening patterns provide a path for removing bubbles formed between the top protection film and the lower substrate;

cutting the lower substrate between two adjacent display structures among the plurality of display structures along a first cutting line that is located at at least a portion of the top opening patterns;

separating the lower substrate to form a plurality of display panels each including the display structure and a portion of the lower substrate; and removing the top protection film.

* * * * *